(12) United States Patent
Lee et al.

(10) Patent No.: US 12,456,689 B2
(45) Date of Patent: Oct. 28, 2025

(54) INTERCONNECT DEVICE AND SEMICONDUCTOR ASSEMBLY INCORPORATING THE SAME

(71) Applicant: STATS ChipPAC Pte. Ltd., Singapore (SG)

(72) Inventors: GunHyuck Lee, Incheon (KR); SangHyun Son, Seoul (KR)

(*) Notice: Subject to any disclaimer, the term of this patent is extended or adjusted under 35 U.S.C. 154(b) by 391 days.

(21) Appl. No.: 18/302,807

(22) Filed: Apr. 19, 2023

(65) Prior Publication Data
US 2023/0343717 A1 Oct. 26, 2023

(30) Foreign Application Priority Data
Apr. 21, 2022 (CN) .......... 202210424336.5

(51) Int. Cl.
*H01L 23/538* (2006.01)
*H01L 25/16* (2023.01)

(52) U.S. Cl.
CPC ........ *H01L 23/5385* (2013.01); *H01L 25/162* (2013.01)

(58) Field of Classification Search
CPC .......... H01L 23/5385; H01L 25/162
See application file for complete search history.

(56) References Cited

U.S. PATENT DOCUMENTS

| | | | |
|---|---|---|---|
| 6,410,983 B1 | 6/2002 | Moriizumi et al. | |
| 7,989,929 B2 | 8/2011 | Fjelstad et al. | |
| 9,418,966 B1 | 8/2016 | Kwon et al. | |
| 2020/0168538 A1* | 5/2020 | Ong | H01L 25/0652 |
| 2020/0357768 A1 | 11/2020 | Shih et al. | |
| 2020/0411488 A1 | 12/2020 | Yu et al. | |
| 2021/0407962 A1* | 12/2021 | Kim | H01L 23/5383 |

FOREIGN PATENT DOCUMENTS

| | | |
|---|---|---|
| TW | 201342546 A | 10/2013 |
| TW | 202002348 A | 1/2020 |
| TW | 202213695 A | 4/2022 |

OTHER PUBLICATIONS

Lee, WO 2016043779, Mar. 24, 2016 (Year: 2016).*

* cited by examiner

*Primary Examiner* — Mary Ellen Bowman
(74) *Attorney, Agent, or Firm* — Junhe Law Office, P.C.; Yi Zhang

(57) ABSTRACT

An interconnect device comprises an insulating frame. The insulating frame comprises: a top insulating layer formed uppermost of the insulating frame and occupying an entirety of a top surface of the insulating frame; a bottom insulating layer formed lowermost of the insulating frame and occupying an entirety of a bottom surface of the insulating frame; and a central insulating layer that includes a plurality of insulators disposed between the top insulating layer and the bottom insulating layer, wherein the plurality of insulators form a plurality of through-holes between a first lateral surface and a second lateral surface of the central insulating layer. The interconnect device further comprises a plurality of bridge conductors, wherein each of the plurality of bridge conductors is disposed within a respective one of the plurality of through-holes and extends between the first lateral surface and the second lateral surface of the central insulating layer.

15 Claims, 15 Drawing Sheets

INTERCONNECT DEVICE AND SEMICONDUCTOR ASSEMBLY INCORPORATING THE SAME

TECHNICAL FIELD

The present application generally relates to semiconductor devices, and more particularly, to an interconnect device for connecting two adjacent semiconductor packages and a semiconductor assembly incorporating such interconnect device.

BACKGROUND OF THE INVENTION

The semiconductor industry is constantly faced with complex integration challenges as consumers want their electronics to be smaller, faster and higher performance with more and more functionality packed into a single semiconductor package. One of the solutions is System-in-Package (SiP). SiP is a functional electronic system or sub-system that includes two or more heterogeneous semiconductor dice, such as a logic chip, a memory, integrated passive devices (IPD), RF filters, sensors, heat sinks, or antennas. However, there is a challenge that the distance between semiconductor packages must be continuously reduced in order to reduce the size of SiP system.

Therefore, a need exists for an interconnect device for connecting semiconductor packages.

SUMMARY OF THE INVENTION

An objective of the present application is to provide an interconnect device for connecting two adjacent semiconductor packages with a reduced distance between the two semiconductor packages.

In an aspect of the present application, there is provided an interconnect device. The interconnect device comprises: an insulating frame, wherein the insulating frame comprises: a top insulating layer formed uppermost of the insulating frame and occupying an entirety of a top surface of the insulating frame; a bottom insulating layer formed lowermost of the insulating frame and occupying an entirety of a bottom surface of the insulating frame; and a central insulating layer that includes a plurality of insulators disposed between the top insulating layer and the bottom insulating layer, wherein the plurality of insulators form a plurality of through-holes between a first lateral surface and a second lateral surface of the central insulating layer; and a plurality of bridge conductors, wherein each of the plurality of bridge conductors is disposed within a respective one of the plurality of through-holes and extends between the first lateral surface and the second lateral surface of the central insulating layer.

In another aspect of the present application, there is provided an interconnect device. The interconnect device comprises: a plurality of insulators; a plurality of bridge conductors, wherein every two of the plurality of bridge conductors are separated from each other by one of the plurality of insulators.

In some other aspects of the present application there are provided semiconductor package assemblies comprises any of the aforementioned interconnect device.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one sub-unit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
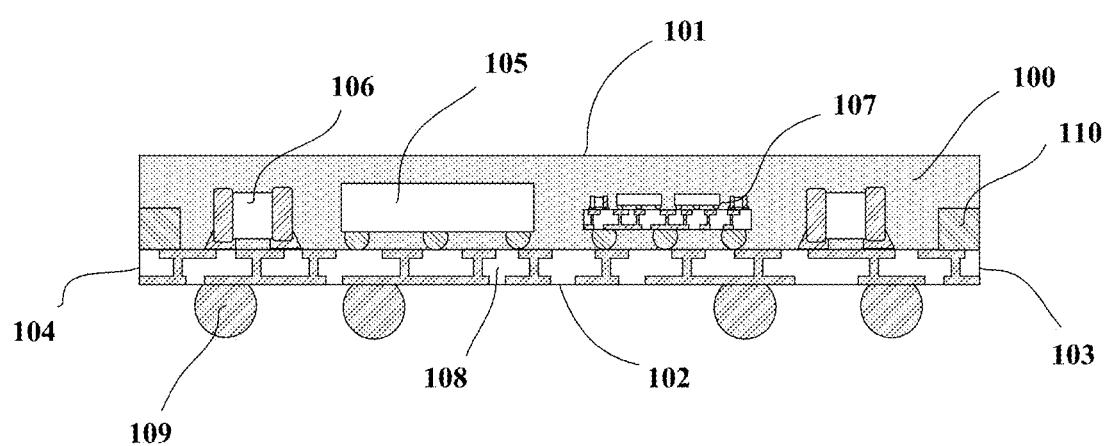
FIG. 1 is a schematic cross-sectional diagram showing an example of a semiconductor package.

FIG. 1 is a schematic cross-sectional diagram showing an example of a semiconductor package 100 according to an embodiment of the present application. As shown in FIG. 1, the semiconductor package 100 includes a top surface 101, a bottom surface 102, a first lateral surface 103 and a second lateral surface 104. The first lateral surface 103 is opposite to the second lateral surface 104. The semiconductor package 100 may include one or more semiconductor devices, for example, one or more semiconductor dices 105, one or more discrete devices 106 and/or one or more internal semiconductor packages 107 which may have a similar structure as the semiconductor package 100. Although a semiconductor die 105, two discrete devices 106 and an internal semiconductor package 107 are shown in FIG. 1 for illustration purpose, those skilled in the art can understand that a semiconductor package may include any number of semiconductor dices, discrete devices and/or internal semiconductor packages, or may not include any of semiconductor dice, discrete devices or internal semiconductor packages. The semiconductor package 100 may include a substrate 108 which supports the semiconductor dices 105, discrete device 106 and internal semiconductor package 107 on one side and connects to one or more bottom connectors 109 on the other side. The bottom connectors 109 can include, for example, a plurality of solder balls for electrically connecting the semiconductor package 100 to another base board such as a printed circuit board (PCB) or the like.

The semiconductor package 100 further includes lateral connectors 110 respectively exposed from the first lateral surface 103 and the second lateral surface 104, for connecting with lateral connectors of one or more other semiconductor packages via an interconnect device (will be illustrated below in detail). Although the semiconductor package 100 is shown as including lateral connectors 110 exposed from both the first lateral surface 103 and the second lateral surface 104, those skilled in the art can understand that a semiconductor package may only include one or more lateral connectors exposed from one of the first lateral surface and the second lateral surface. For example, if no semiconductor package is positioned adjacent to the second lateral surface 104, then there may be no lateral connector exposed from the second lateral surface 104. The lateral connectors 110 can be made of various materials with good conductivity, such as Al, Cu, Sn, Ni, Au, Ag, titanium (Ti), tungsten (W), or other suitable electrically conductive material. In some other examples, a semiconductor package may have more lateral surfaces (e.g. a cuboid-shaped package may have four lateral surfaces) than the first and second lateral surfaces 103 and 104 that are desired to connect with other semiconductor packages, and accordingly, there may be lateral connectors disposed on the additional surfaces.

In some embodiments, the substrate 108 may include a redistribution structure (RDS) having one or more dielectric layers and one or more conductive layers between and through the dielectric layers. The conductive layers may define pads, traces and plugs through which electrical signals or voltages can be distributed horizontally and vertically across the RDS. The conductive layers may be one or more layers of Al, Cu, Sn, Ni, Au, Ag, titanium (Ti), tungsten (W), or other suitable electrically conductive material. The lateral connectors 110 may be electrically connected to the semiconductor die 105, discrete devices 106 and internal semiconductor package 107 via the one or more conductive layers in the substrate 108.

Figure 2A:
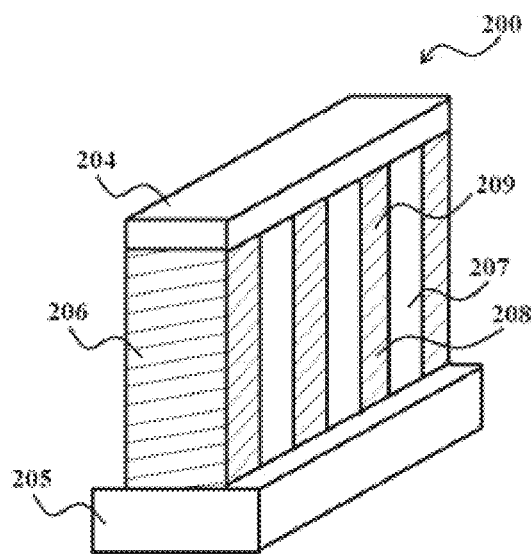
FIG. 2A is a schematic diagram showing an example of a T-shaped interconnect device according to an embodiment of the present application.
Figure 2B:
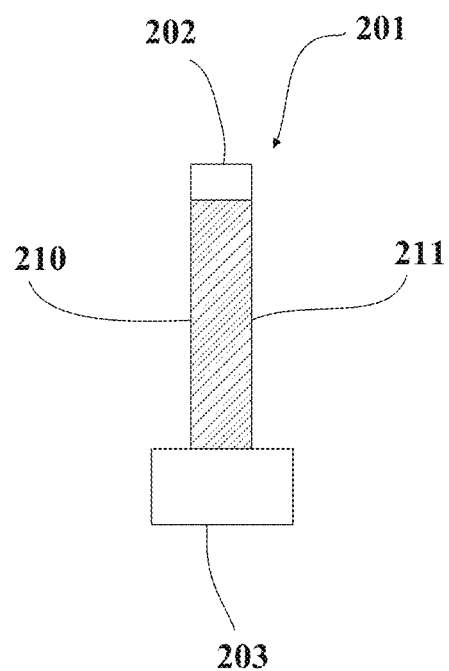
FIG. 2B is a side-view of the interconnect device shown in FIG. 2A.

FIG. 2A is a schematic diagram showing an example of a T-shaped interconnect device 200 that can electrically connect two adjacent semiconductor packages, and FIG. 2B is a side-view of the interconnect device 200. The interconnect device 200 includes an insulating frame 201 which has a top surface 202 and a bottom surface 203. The insulating frame 201 can be made of various insulating materials, such as rubber or polymer.

As shown in FIGS. 2A and 2B, the insulating frame 201 includes three layers, i.e., a top insulating layer 204, a bottom insulating layer 205 and a central insulating layer 206. The top insulating layer 204 is formed uppermost of the insulating frame 201 and occupies an entirety of the top surface 202 of the insulating frame 201. The bottom insulating layer 205 is formed lowermost of the insulating frame 201 and occupies an entirety of the bottom surface 203 of the insulating frame 201. The central insulating layer 206 includes a plurality of insulators 207 disposed between the top insulating layer 204 and the bottom insulating layer 205, and the plurality of insulators 207 form a plurality of through-holes 209 between a first lateral surface 210 and a second lateral surface 211 of the central insulating layer 206. As shown in FIG. 2A and FIG. 2B, the bottom insulating layer 205 may have a width greater than that of the central insulating layer or the top insulating layer.

The interconnect device 200 further includes a plurality of bridge conductors 208. Each of the bridge conductors 208 can be disposed within one of the through-holes 209 of the insulating frame 201. As can be seen from FIG. 2B, each of the bridge conductors 208 extends between the first lateral surface 210 and the second lateral surface 211 of the central insulating layer 206. Although the interconnect device 200 is shown as including three insulators 207, four through-holes 209 and four bridge conductors 208, those skilled in the art can understand that an interconnect device may include any number of insulators, through-holes and bridge conductors based on practical needs. The bridge conductors 208 may include one or more conductive materials such as Al, Cu, Sn, Ni, Au, Ag, titanium (Ti), tungsten (W), or other suitable electrically conductive material. In a preferred embodiment, the bridge conductors 208 may include solder.

Figure 3:
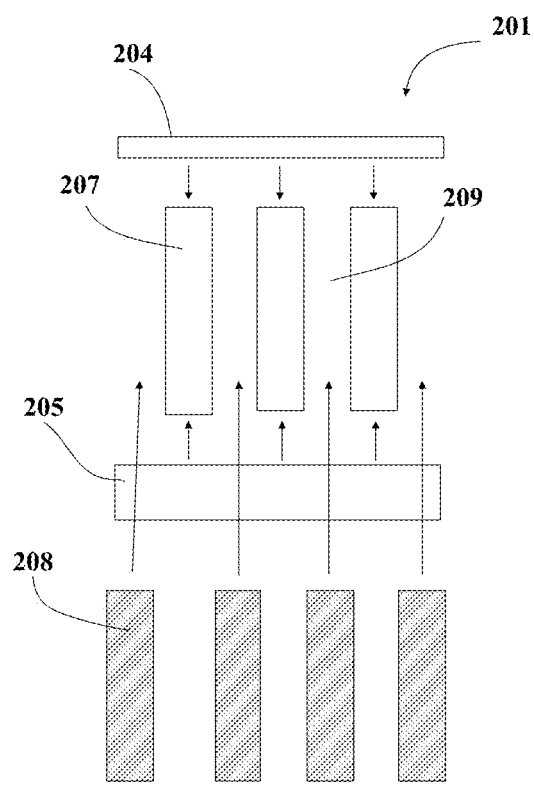
FIG. 3 is a schematic diagram showing a process for forming the interconnect device shown in FIGS. 2A and 2B according to an embodiment of the present application.

FIG. 3 is a schematic diagram showing a process for forming the interconnect device 200 shown in FIGS. 2A and 2B according to an embodiment of the present application. As can be seen, the top insulating layer 204, the bottom insulating layer 205 and the insulators 207 are formed separately, and the bridge conductors 208 are also formed separately. The separately formed top insulating layer 204, bottom insulating layer 205 and insulators 207 are attached together to form the insulating frame 201, and the bridge conductors 208 are then filled into the through-holes 209 respectively to complete the interconnect device 200. In an embodiment, each block (i.e., the top insulating layer 204, the bottom insulating layer 205, the insulators 207 and the bridge conductors 208) of the interconnect device 200 can be attached to one or more another block of the interconnect device 200 with an adhesive material, for example, with an insulating adhesive material. In another embodiment, the blocks of the interconnect device 200 can be attached with each other by soldering.

Figure 4:
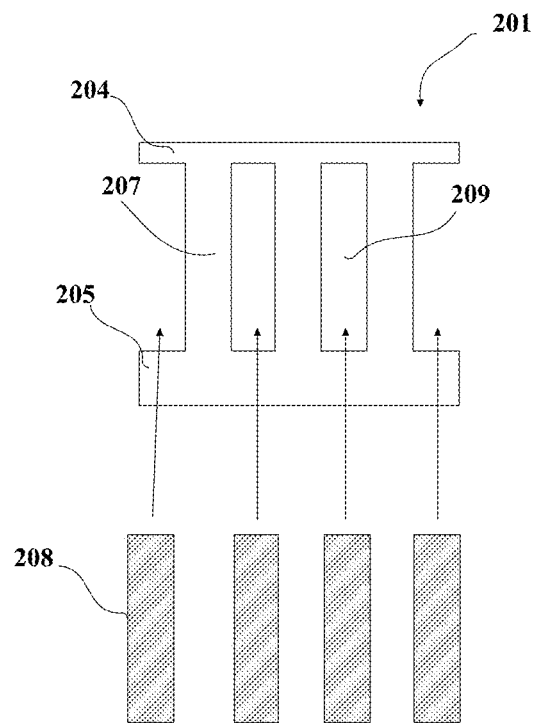
FIG. 4 is a schematic diagram showing a process for forming the interconnect device shown in FIGS. 2A and 2B according to another embodiment of the present application.

FIG. 4 is a schematic diagram showing a process for forming the interconnect device 200 shown in FIGS. 2A and 2B according to another embodiment of the present application. As shown in FIG. 4, the insulating frame 201 is formed integrally and the bridge conductors 208 are formed separately. In one embodiment, the insulating frame is formed by a molding process. In another embodiment, the insulating frame is formed by forming a whole insulating substrate and then forming the through-holes 209 on the whole insulating substrate though cutting. The separately formed bridge conductors 208 are then filled into the through-holes 209 to complete the interconnect device 200. In an embodiment, the bridge conductors 208 are filled into the through-holes 209 with an adhesive material, for example, with an insulating adhesive material. In another embodiment, the bridge conductors 208 can be filled into the through-holes 209 by soldering.

Figure 5A:
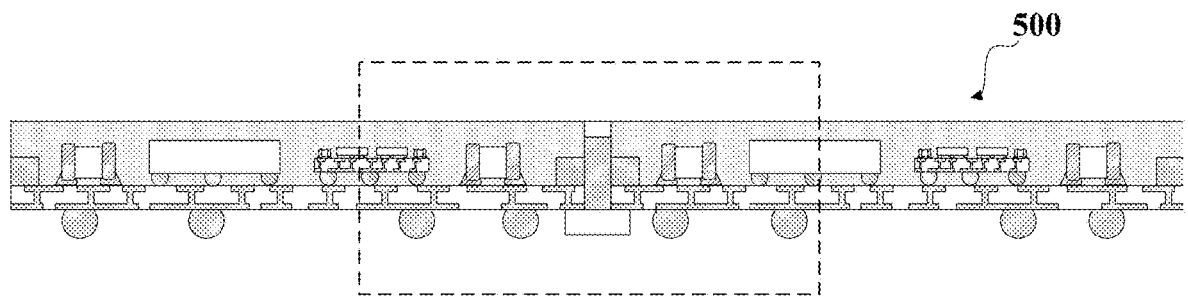
FIG. 5A is a schematic cross-sectional diagram showing an example of a semiconductor package assembly according to an embodiment of the present application.
Figure 5B:
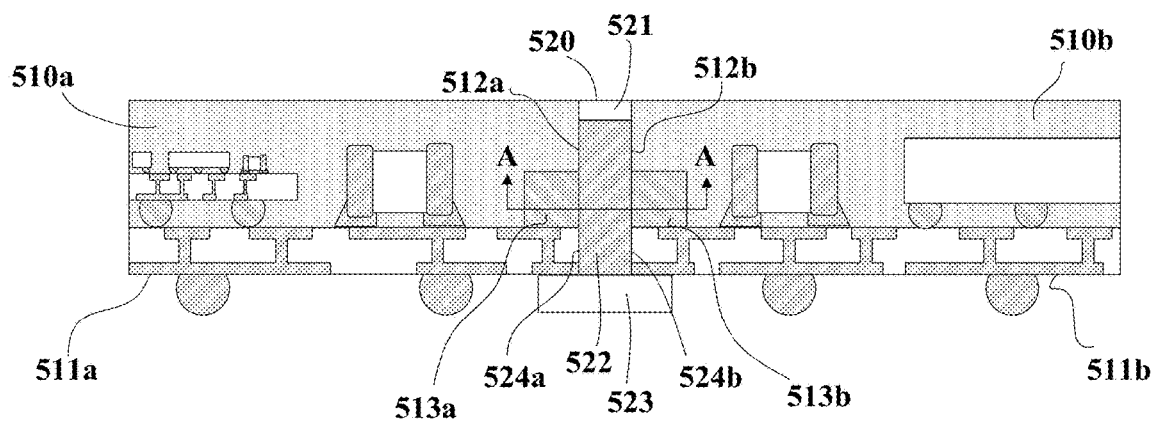
FIG. 5B is a partial enlarged view of the semiconductor package assembly shown in FIG. 5A.
Figure 5C:
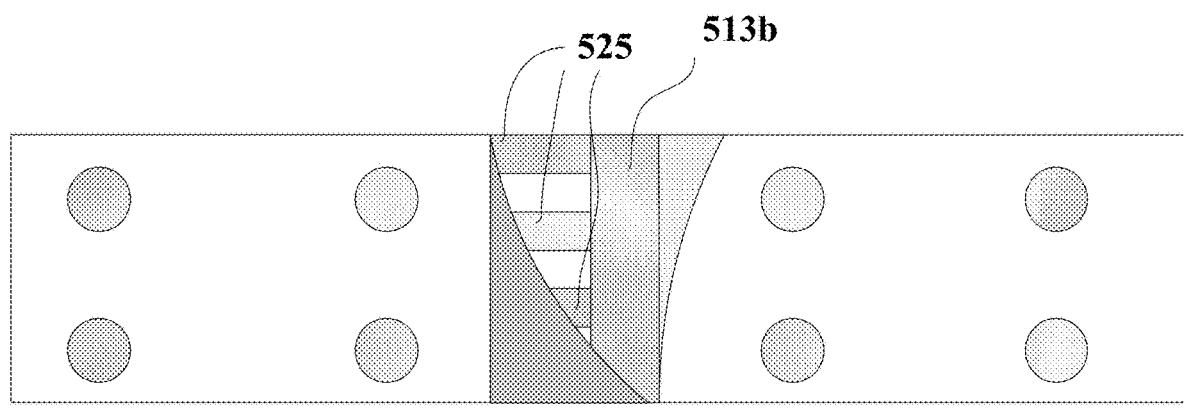
FIG. 5C is a bottom view of the semiconductor package assembly shown in FIG. 5B with a partial cross-sectional view along a line A-A in FIG. 5B.

FIG. 5A is a schematic cross-sectional diagram showing an example of a semiconductor package assembly 500, FIG. 5B is a partial enlarged view of the semiconductor package assembly 500 showing an electrical connection between a first semiconductor package 510a and a second semiconductor package 510b via a T-shaped interconnect device 520, and FIG. 5C is a bottom view of the semiconductor package assembly 500 with a partial cross-sectional view along a line A-A shown in FIG. 5B.

As shown in FIG. 5, the semiconductor package assembly 500 includes the first semiconductor package 510a and the second semiconductor package 510b which are connected with each other via the interconnect device 520. The first semiconductor package 510a and the second semiconductor package 510b may have a similar structure as the semiconductor package 100 shown in FIG. 1, and the interconnect device 520 may have a similar structure as the interconnect device 200 shown in FIGS. 2A and 2B.

As shown in FIG. 5B, the T-shaped interconnect device 520 is inserted between the first semiconductor package 510a and the second semiconductor package 510b. In particular, a top insulating layer 521 and a central insulating layer 522 of the interconnect device 520 is disposed between the first semiconductor package 510a and the second semiconductor package 510b, and a broader bottom insulating layer 523 of the interconnect device 520 is disposed below bottom surfaces 511a and 511b of the first semiconductor package 510a and the second semiconductor package 510b. Therefore, a first lateral surface 524a of the central insulating layer 522 can contact a first lateral surface 512a of the first semiconductor package 510a, and the second lateral surface 524b of the central insulating layer 522 can contact a second lateral surface 512b of the second semiconductor package 510b. Accordingly, as shown in FIG. 5C, at least a portion of the bridge conductors 525 of the interconnect device 520 may contact a lateral connector 513a exposed from the first lateral surface 512a of the first semiconductor package 510a and a lateral connector 513b exposed from the second lateral surface 512b of the second semiconductor package 510b. As such, the lateral connector 513a of the first semiconductor package 510a can be electrically connected to the lateral connector 513b of the second semiconductor package 510b, thereby electrically connecting the internal devices of the first semiconductor packages 510a and 510b. Since the two semiconductor packages 510a and 510b are connected through the interconnect device 520 at their adjacent lateral surfaces, rather than through another interconnect device attached to the bottom surfaces of the two semiconductor packages 510a and 510b, the distance between adjacent solder balls of the semiconductor packages 510a and 510b can be significantly reduced. In this way, the structure of the semiconductor package assembly can be compact.

Figure 6A:
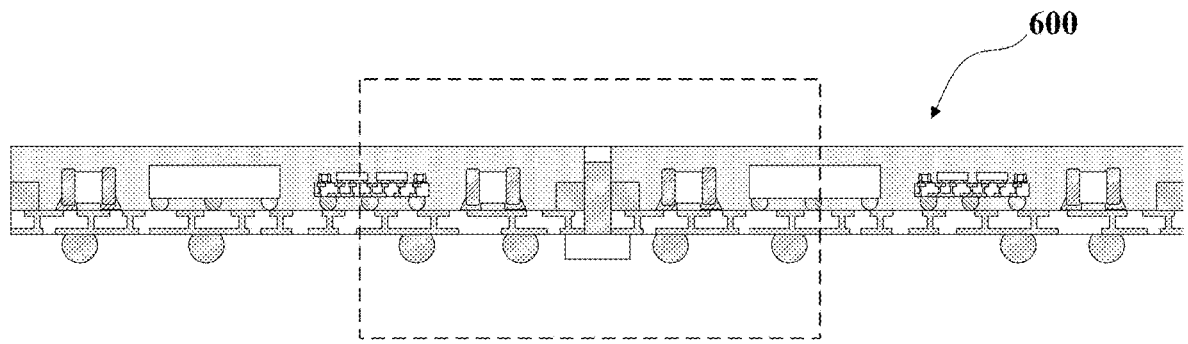
FIG. 6A is a schematic cross-sectional diagram showing an example of a semiconductor package assembly according to another embodiment of the present application.
Figure 6B:
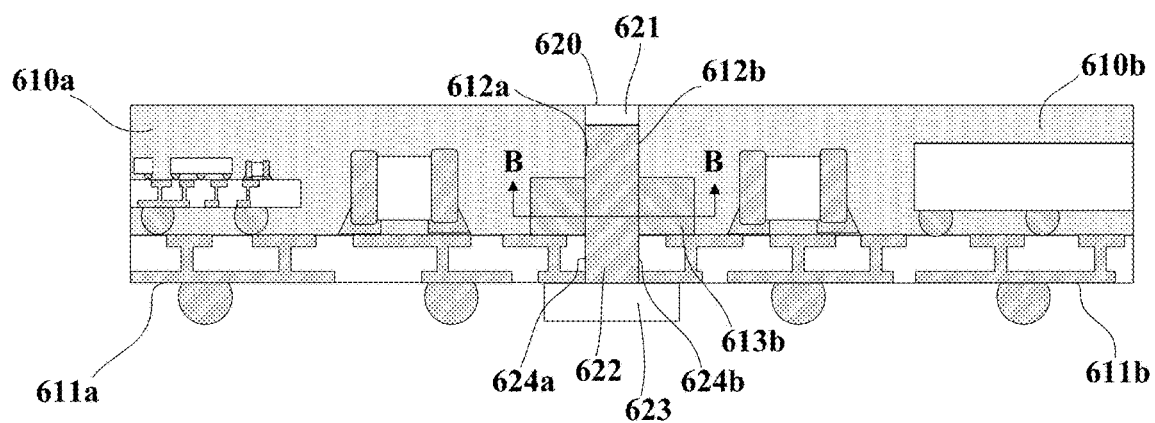
FIG. 6B is a partial enlarged view of the semiconductor package assembly shown in FIG. 6A.
Figure 6C:
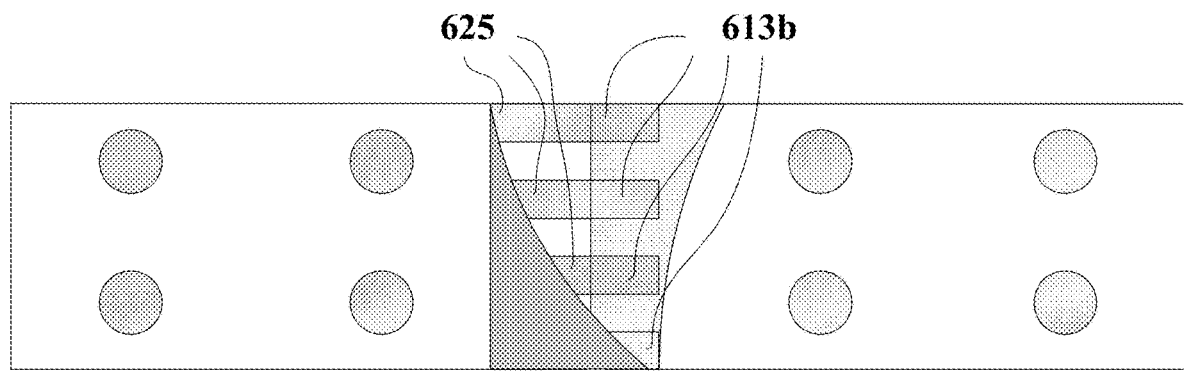
FIG. 6C is a bottom view of the semiconductor package assembly shown in FIG. 6B with a partial cross-sectional view along a line B-B in FIG. 6B.

FIG. 6A is a schematic diagram showing an example of a semiconductor package assembly 600, FIG. 6B is a partial enlarged view of the semiconductor package assembly 600 showing an electrical connection between a first semiconductor package 610a and a second semiconductor package 610b via a T-shaped interconnect device 620, and FIG. 6C is a bottom view of the semiconductor package assembly 600 with a partial cross-sectional view along a line B-B in FIG. 6B.

As shown in FIG. 6A, the semiconductor package assembly 600 has a similar structure as the semiconductor package assembly 500 shown in FIGS. 5A-5C. In particular, the T-shaped interconnect device 620 is inserted between the first semiconductor package 610a and the second semiconductor package 610b, therefore a first lateral surface 624a of a central insulating layer 622 of the interconnect device 620 can contact a first lateral surface 612a of the first semiconductor package 610a, and a second lateral surface 624b of the central insulating layer 622 of the interconnect device 620 can contact a second lateral surface 612b of the second semiconductor package 610b. Different from the semiconductor package assembly 500 shown in FIGS. 5A-5C, the second semiconductor package 610b includes more than one lateral connectors 613b exposed from the second lateral surface 624b. As shown in FIG. 6C, the semiconductor package 610b includes four lateral connectors 613b each contacting one of the bridge conductors 625.

It should be noted that the first semiconductor package and the second semiconductor package may include different numbers of lateral connector or include the same number of lateral connectors. In the case that a semiconductor package includes more than one lateral connectors exposed from one lateral surface, the number of the lateral connectors may be the same as or different from the number of bridge conductors of a corresponding interconnect device. Those skilled in the art can understand that the number of lateral connectors included in a semiconductor package can be adjusted based on practical needs and design requirements, and the present application is not limited to any specific number of lateral connectors included in a semiconductor package.

Figure 7:
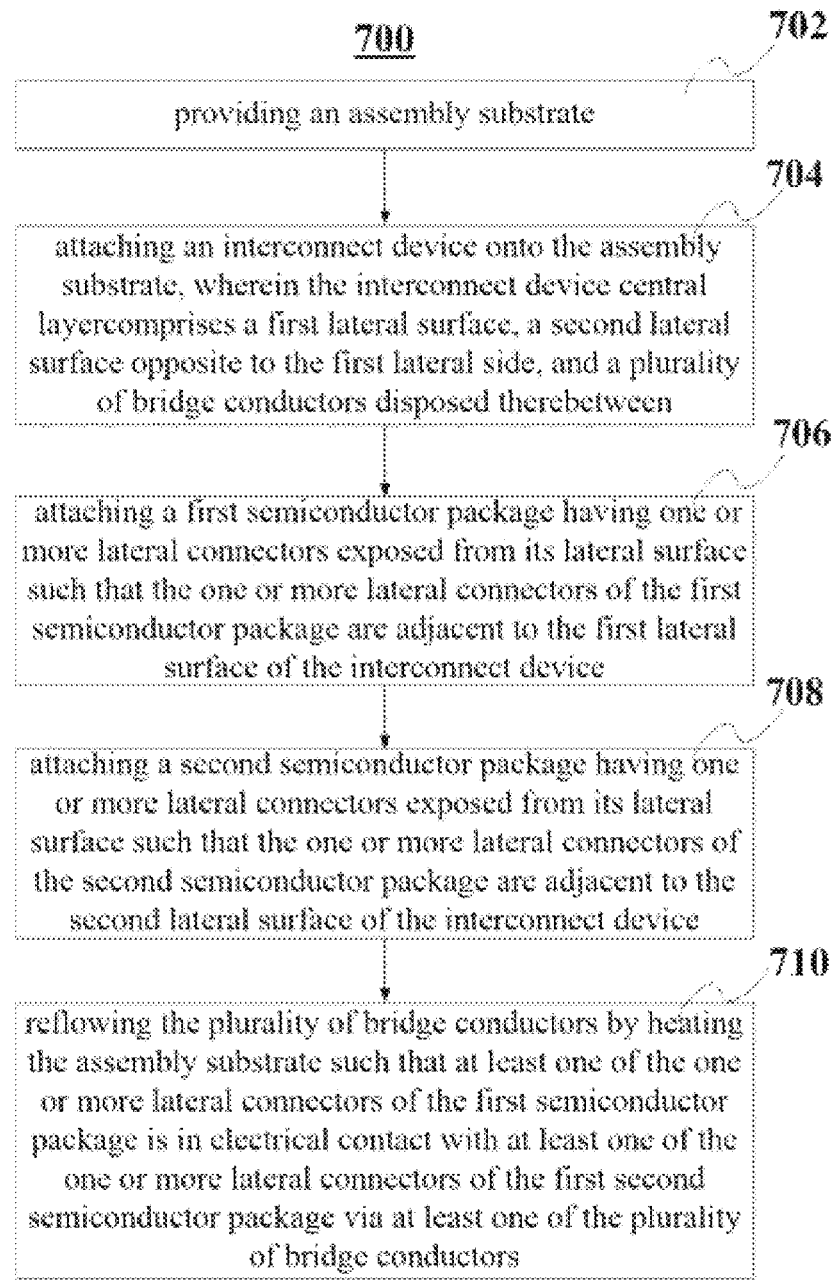
FIG. 7 is a flowchart illustrating a method for making a semiconductor package assembly according to an embodiment of the present application.

FIG. 7 is a flowchart illustrating a method 700 for making a semiconductor package assembly according to an embodiment of the present application, and FIGS. 8A-8D are schematic diagram showing the process for making a semiconductor package 800 according to the method 700 shown in FIG. 7. The method 700 will be elaborated below with reference to FIGS. 8A-8D.

The method 700 starts with step 702 of providing an assembly substrate. See FIG. 8A, an assembly substrate 801 is provided, which is for supporting the semiconductor packages 800 as well as an interconnect device of the semiconductor package 800 (see FIG. 8D).

Figure 8A:
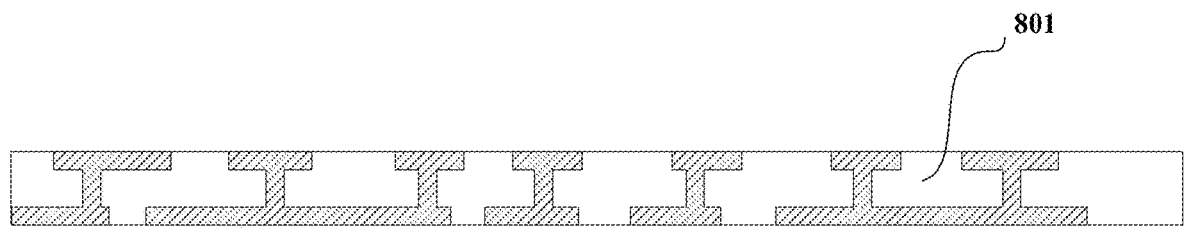
FIGS. 8A-8D are schematic diagrams showing a process for making a semiconductor package according to the method shown in FIG. 7.
Figure 8B:
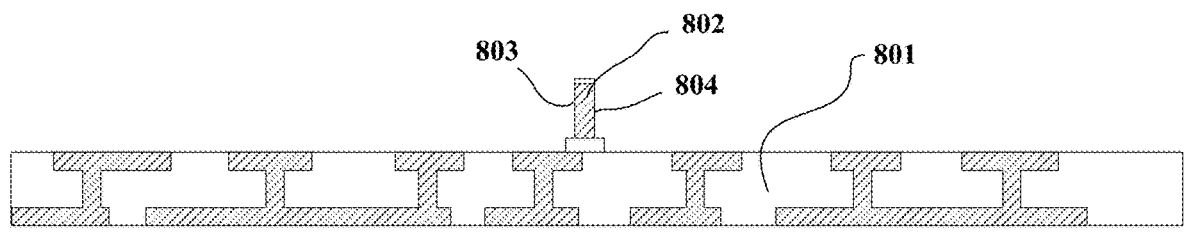

In step 704, an interconnect device is attached onto the assembly substrate. The interconnect device may include a first lateral surface, a second lateral surface opposite to the first lateral side, and a plurality of bridge conductors disposed between the first and second lateral surfaces. As shown in FIG. 8B, an interconnect device 802 is attached onto the assembly substrate 801. The interconnect device 802 may have a similar structure as the interconnect device 200 shown in FIGS. 2A and 2B, the interconnect device 520 shown in FIG. 5 or the interconnect device 620 shown in FIG. 6. In particular, the interconnect device 802 includes an insulating frame, a top insulating layer, a bottom insulating layer, and a central insulating layer. The central insulating layer includes a first lateral surface 803 and a second lateral surface 804 opposite to the first lateral surface 803. The interconnect device 802 further includes a plurality of bridge conductors 808 (see FIG. 8D) which are disposed between the first lateral surface 803 and the second lateral surface 804.

Figure 8C:
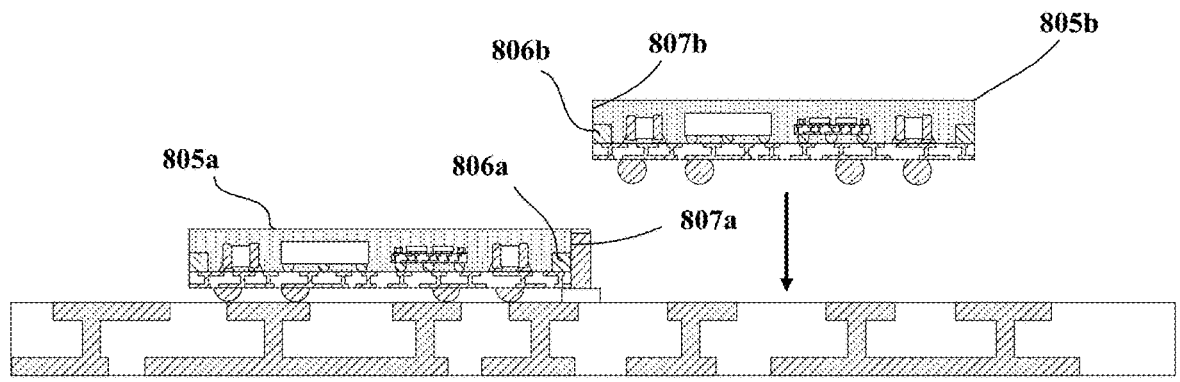

In step 706, a first semiconductor package having one or more lateral connectors exposed from its lateral surface is attached onto the assembly substrate, such that the one or more lateral connectors of the first semiconductor package are adjacent to the first lateral surface of the interconnect device. Furthermore, in a step 708, a second semiconductor package having one or more lateral connectors exposed from its lateral surface is attached onto the assembly substrate, such that the one or more lateral connectors of the second semiconductor package are adjacent to the second lateral surface of the interconnect device. As shown in FIG. 8C, a first semiconductor package 805a and a second semiconductor package 805b are respectively attached onto the assembly substrate 801. As can be seen, lateral connector(s) 806a exposed from a lateral surface 807a of the first semiconductor package 805a are adjacent to the first lateral surface 803 of the interconnect device 802, and lateral connector(s) 806b exposed from a lateral surface 807b of the second semiconductor package 805b are adjacent to the second lateral surface 804 of the interconnect device 802.

Figure 8D:
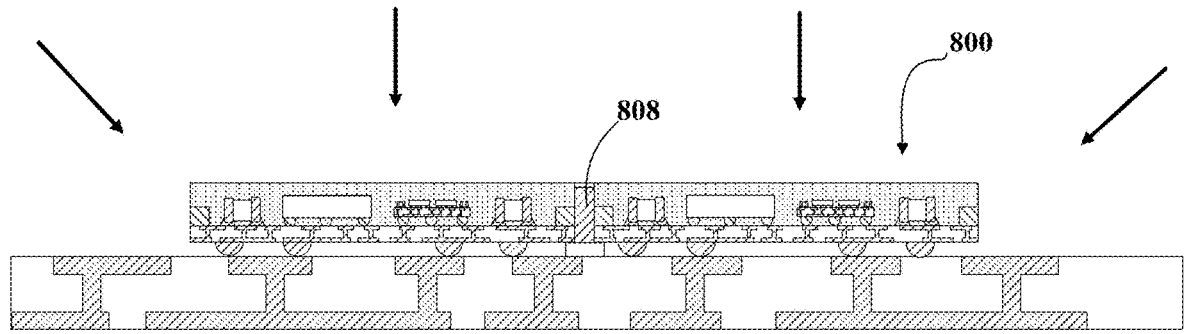

In step 710, the plurality of bridge conductors can be reflowed such that at least one of the one or more lateral connectors of the first semiconductor package is in electrical contact with at least one of the one or more lateral connectors of the second semiconductor package via at least one of the plurality of bridge conductors. As shown in FIG. 8D, the plurality of bridge conductors 808 of the interconnect device 802 can be reflowed by heating the assembly substrate 801, for example. The lateral connector(s) 806a are then in electrical contact with the connector(s) 806b via at least one of the plurality of bridge conductors 808. The electrical contact between the lateral connector(s) 806a and the lateral connector(s) 806b via the bridge conductors 808 may be similar as the electrical contact shown in FIG. 5 or 6.

Figure 9:
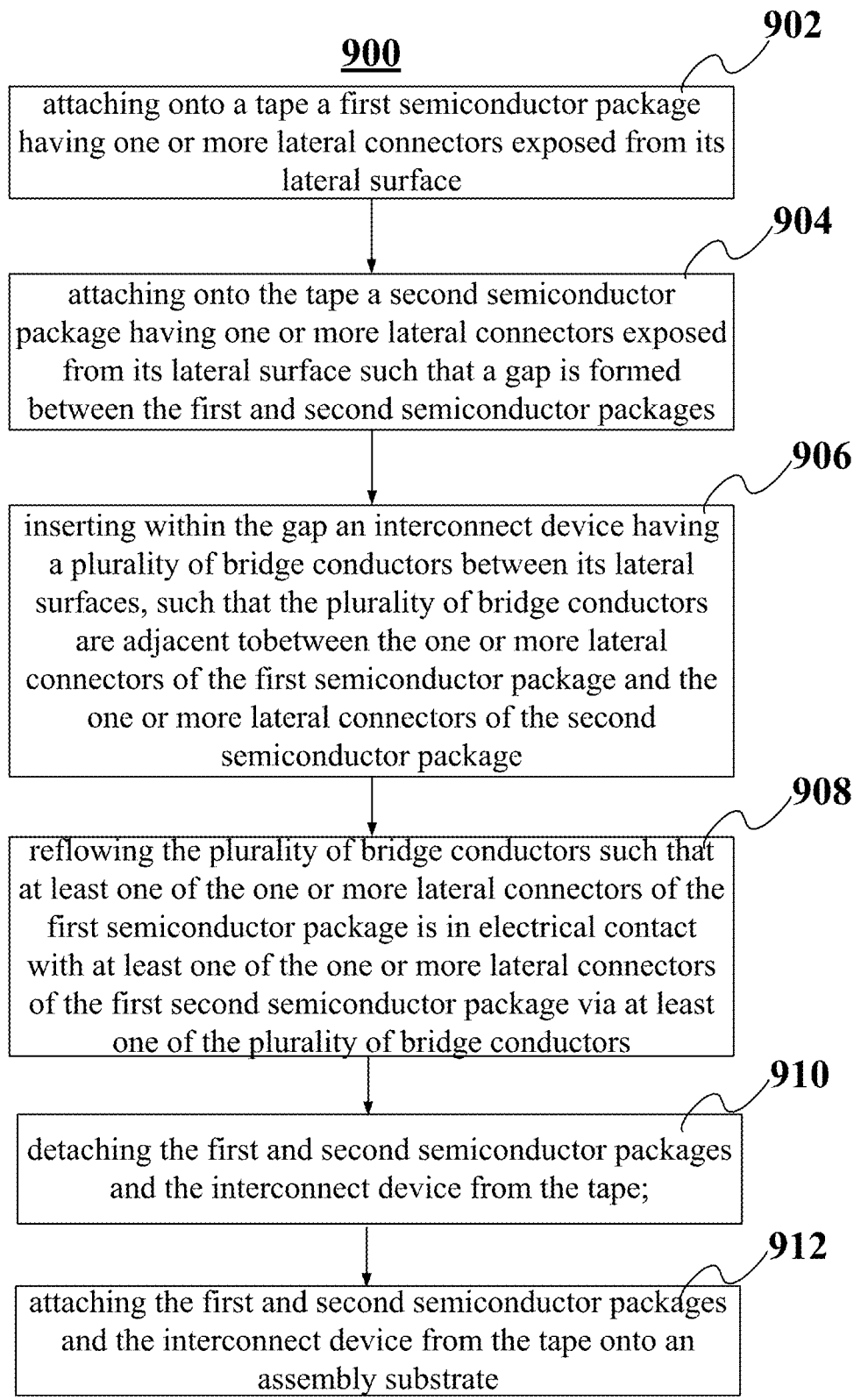
FIG. 9 is a flowchart illustrating a method for making a semiconductor package assembly according to another embodiment of the present application.

FIG. 9 is a flowchart illustrating a method 900 for making a semiconductor package assembly according to another embodiment of the present application, and FIGS. 10A-10E are schematic diagrams showing a process for making a semiconductor package 1000 according to the method 900 shown in FIG. 9. The method 900 will be elaborated below with reference to FIGS. 10A-10E.

Figure 10A:
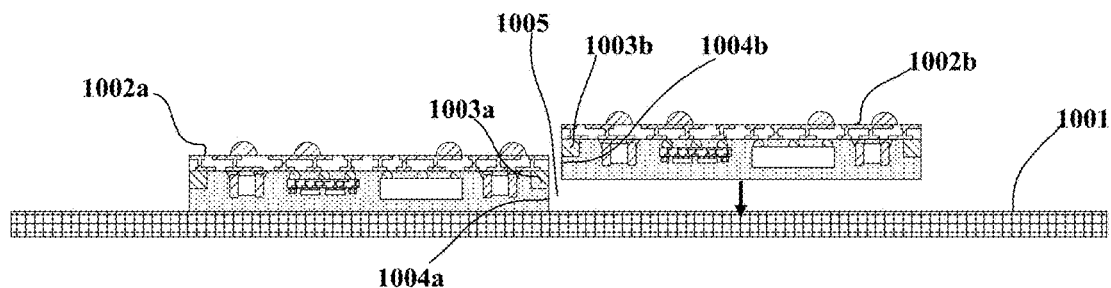
FIGS. 10A-10E are schematic diagrams showing a process for making a semiconductor package according to the method shown in FIG. 9.

As shown in FIG. 9, the method 900 starts with step 902 of attaching onto a tape a first semiconductor package having one or more lateral connectors exposed from its lateral surface. Afterwards, in step 904, a second semiconductor package having one or more lateral connectors exposed from its lateral surface can be attached onto the tape, distant from the first semiconductor package. As such, a gap is formed between the first and second semiconductor packages. As shown in FIG. 10A, an ultraviolet (UV) tape 1001 is provided, and a first semiconductor package 1002a and a second semiconductor package 1002b are attached onto the UV tape 1001. The first semiconductor package 1002a and the second semiconductor package 1002b may have a structure similar as the semiconductor package 100 shown in FIG. 1, the first semiconductor package 510a and the second semiconductor package 510b shown in FIG. 5, or the first semiconductor package 610a and the second semiconductor package 610b shown in FIG. 6. Lateral connector(s) 1003a exposed from a lateral surface 1004a of the first semiconductor package 1002a are adjacent to lateral connector(s) 1003b exposed from a lateral surface 1004b of the second semiconductor package 1002b, with a gap 1005 formed between the first semiconductor package 1002a and the second semiconductor package 1002b.

Figure 10B:
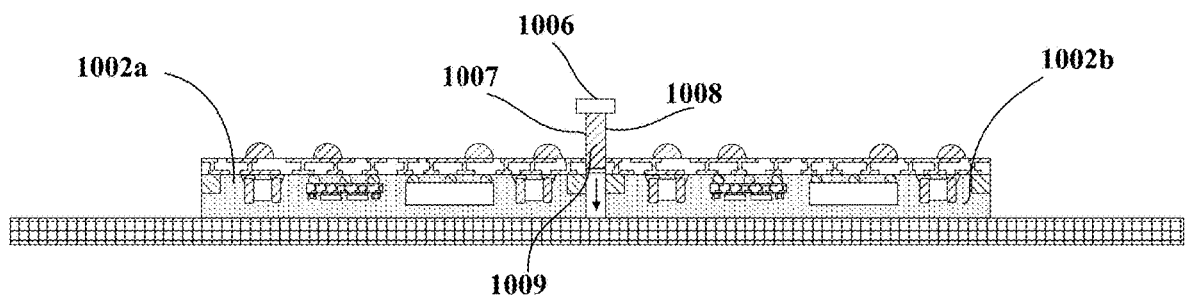

In step 906, an interconnect device having a plurality of bridge conductors between its lateral surfaces is inserted within the gap between the first and second semiconductor packages, such that the plurality of bridge conductors are disposed between the one or more lateral connectors of the first semiconductor package and the one or more lateral connectors of the second semiconductor package. As shown in FIG. 10B, an interconnect device 1006 is inserted within the gap 1005 between the first semiconductor package 1002a and the second semiconductor package 1002b. In particular, the interconnect device 1006 includes an insulating frame, a top insulating layer, a bottom insulating layer and a central insulating layer. The central insulating layer includes a first lateral surface 1007 and a second lateral surface 1008 opposite to the first lateral surface 1007. The interconnect device 1006 further includes plurality of bridge conductors 1009 disposed between the first lateral surface 1007 and second lateral surface 1008. The bridge conductors 1009 of the interconnect device 1006 are disposed between the lateral connector(s) 1003*a* and the lateral connector(s) 1003*b*.

Figure 10C:
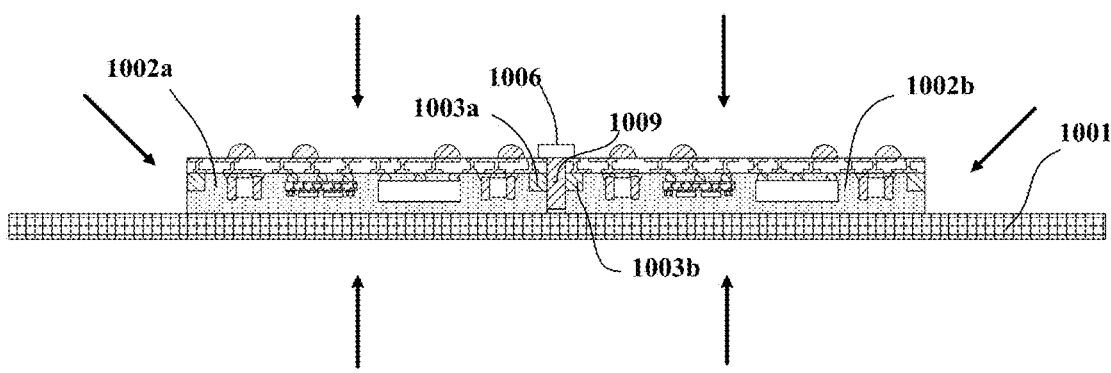

In step 908, the plurality of bridge conductors are reflowed such that at least one of the one or more lateral connectors of the first semiconductor package is in electrical contact with at least one of the one or more lateral connectors of the second semiconductor package via at least one of the plurality of bridge conductors. As shown in FIG. 10C, the bridge conductors 1009 of the interconnect device 1002 are reflowed by heating the tape 1001, for example, such that the lateral connector(s) 1003*a* can be in electrical contact with the lateral connector(s) 1003*b* of the second semiconductor package 1002*b* via at least one of the bridge conductors 1009. The electrical contact between the lateral connector(s) 1003*a* and the lateral connector(s) 1003*b* via the bridge conductors 1009 may be similar as the electrical contact shown in FIG. 5 or 6.

Figure 10D:
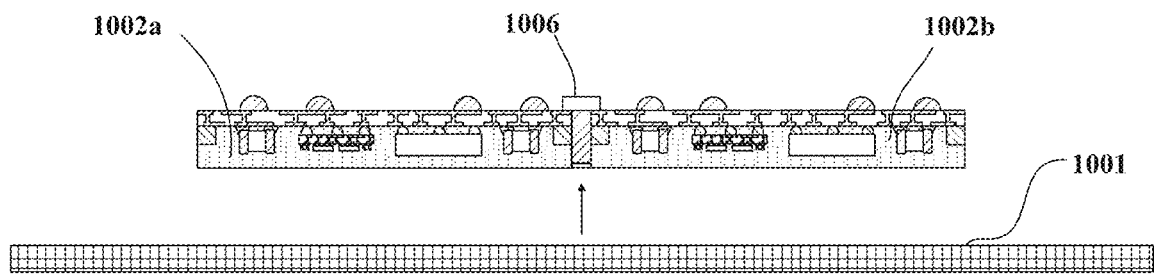
Figure 10E:
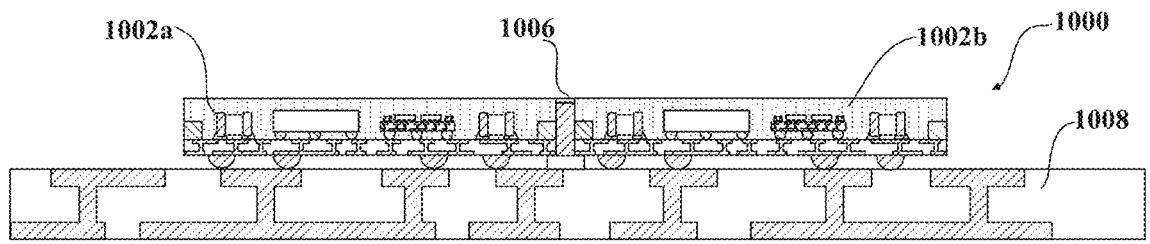

In step 910, the first and second semiconductor packages and the interconnect device are detached from the tape. As shown in FIG. 10D, the first semiconductor package 1002*a* and the second semiconductor package 1002*b* as well as the interconnect device 1006 therebetween are detached from the tape 1001.

In step 912, the first and second semiconductor packages and the interconnect device are attached onto an assembly substrate. As shown FIG. 10E, the first and second semiconductor packages 1002*a* and 1002*b* and the interconnect device 1006 are attached onto an assembly substrate 1008, with their solder balls attached onto the assembly substrate 108. As such, an integral semiconductor package 1000 is formed.

Figure 11A:
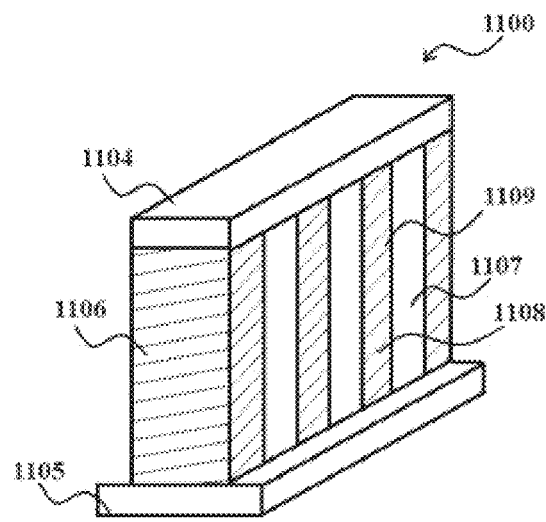
FIG. 11A is a schematic diagram showing an example of a T-shaped interconnect device according to another embodiment of the present application.
Figure 11B:
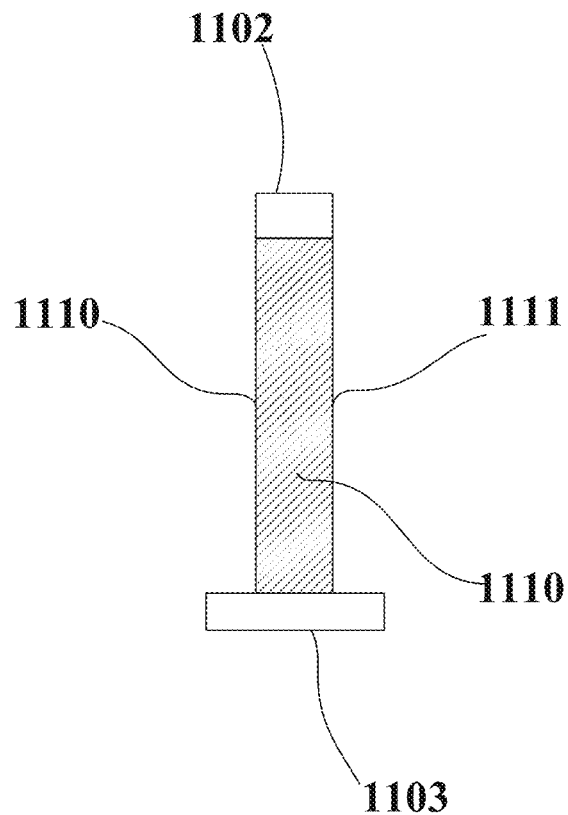
FIG. 11B is a side-view of the interconnect device shown in FIG. 11A.

FIG. 11A is a schematic diagram showing an example of a T-shaped interconnect device 1100 that can connect two adjacent semiconductor packages, and FIG. 11B is a side-view of the interconnect device 1100. Similar as the interconnect device 200 shown in FIGS. 2A and 2B, the interconnect device 1100 includes an insulating frame 1101 made of various insulating materials (e.g., rubber and polymer), and the insulating frame 1101 includes a top insulating layer 1104, a bottom insulating layer 1105 and a central insulating layer 1106. The central insulating layer 1106 includes a plurality of insulators 1107 disposed between the top insulating layer 1104 and the bottom insulating layer 1105, and includes a plurality of through-holes 1109. A plurality of bridge conductors 1108 can be disposed within the through-holes 1109, respectively. Differently, the bottom insulating layer 1105 can be thinner than the bottom insulating layer 205 of the interconnect device 200 shown in FIGS. 2A and 2B.

Figure 12A:
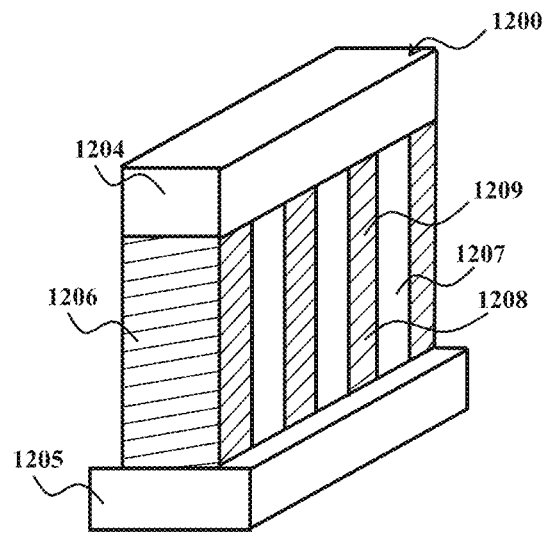
FIG. 12A is a schematic diagram showing an example of a T-shaped interconnect device according to another embodiment of the present application.
Figure 12B:
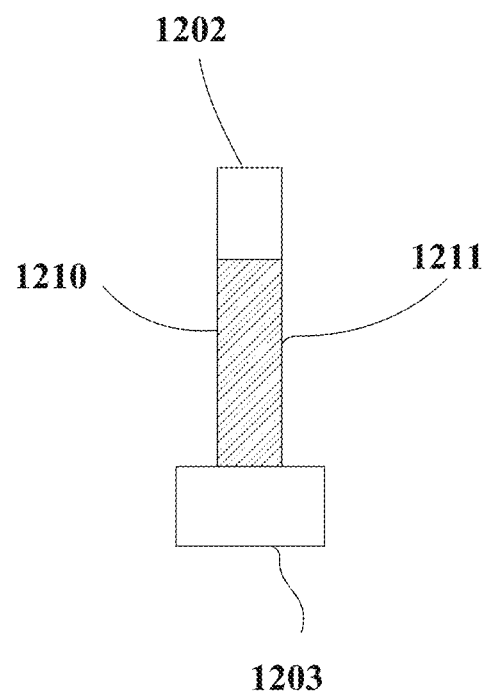
FIG. 12B is a side-view of the interconnect device shown in FIG. 12A.

FIG. 12A is a schematic diagram showing an example of a T-shaped interconnect device 1200 that can connect two adjacent semiconductor packages, and FIG. 12B is a side-view of the interconnect device 1200. Similar as the interconnect device 200 shown in FIGS. 2A and 2B, the interconnect device 1200 includes an insulating frame 1201 made of various insulating materials (e.g., rubber and polymer), and the insulating frame 1201 includes a top insulating layer 1204, a bottom insulating layer 1205 and a central insulating layer 1206. The central insulating layer 1206 includes a plurality of insulators 1207 disposed between the top insulating layer 1204 and the bottom insulating layer 1205, and includes a plurality of through-holes 1209. A plurality of bridge conductors 1208 can be disposed within the through-holes 1209, respectively. Differently, the top insulating layer 1204 is thicker than the top insulating layer 204 of the interconnect device 200 shown in FIGS. 2A and 2B.

Figure 13A:
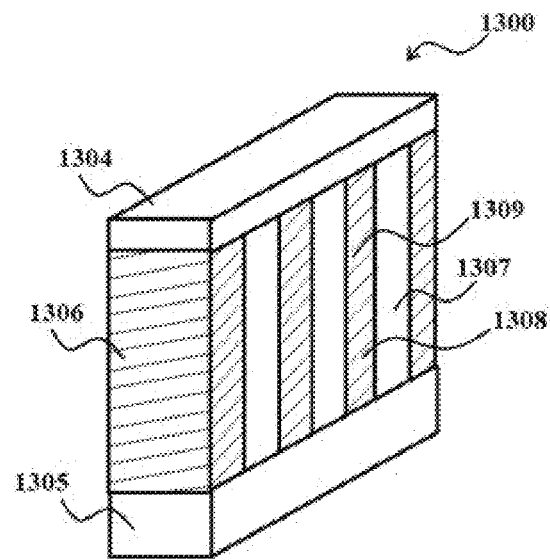
FIG. 13A is a schematic diagram showing an example of an I-shaped interconnect device according to an embodiment of the present application.
Figure 13B:
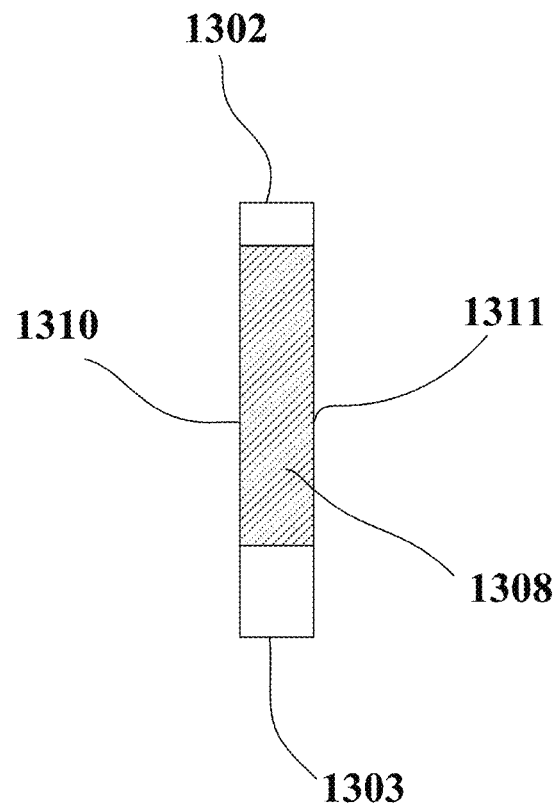
FIG. 13B is a side-view of the interconnect device shown in FIG. 13A.

FIG. 13A is a schematic diagram showing an example of a I-shaped interconnect device 1300 that can connect two adjacent semiconductor packages, and FIG. 13B is a side-view of the interconnect device 1300. Similar as the interconnect device 200 shown in FIGS. 2A and 2B, the interconnect device 1300 includes an insulating frame 1301 made of various insulating materials (e.g., rubber and polymer), and the insulating frame 1301 includes a top insulating layer 1304, a bottom insulating layer 1305 and a central insulating layer 1306. The central insulating layer 1306 includes a plurality of insulators 1307 disposed between the top insulating layer 1304 and the bottom insulating layer 1305, and includes a plurality of through-holes 1309. A plurality of bridge conductors 1308 can be disposed within the through-holes 1309, respectively. Differently, the width of the bottom insulating layer 1305 is the same as the width of the top insulating layer 1304 and the width of the central insulating layer 1306.

Figure 14A:
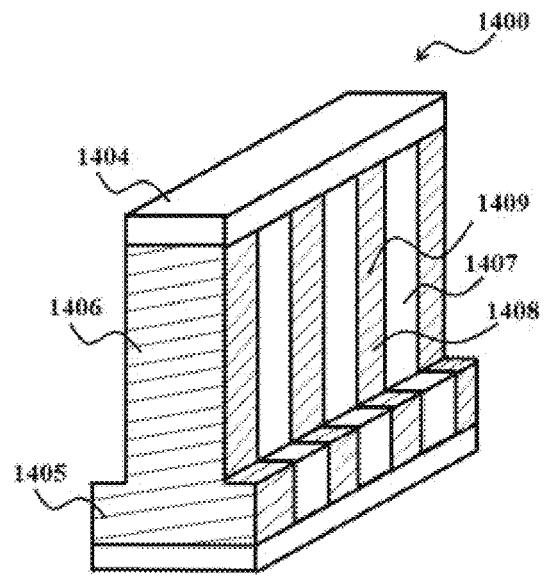
FIG. 14A is a schematic diagram showing an example of a T-shaped interconnect device according to another embodiment of the present application.
Figure 14B:
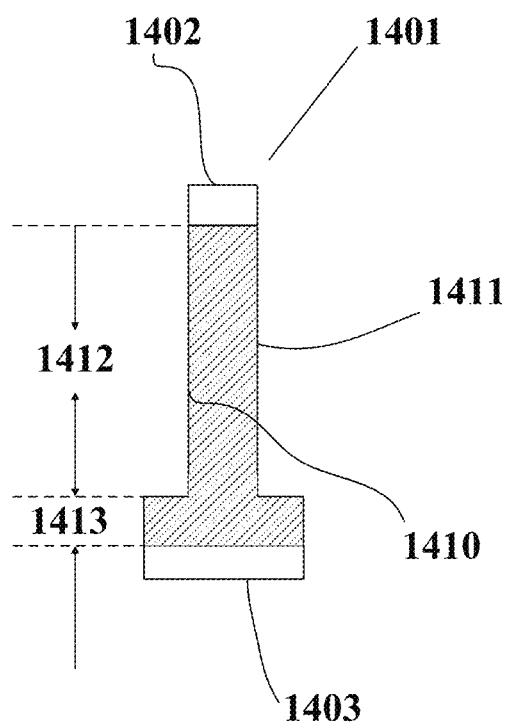
FIG. 14B is a side-view of the interconnect device shown in FIG. 14A.

FIG. 14A is a schematic diagram showing an example of a T-shaped interconnect device 1400 that can connect two adjacent semiconductor packages, and FIG. 14B is a side-view of the interconnect device 1400. Similar as the interconnect device 200 shown in FIGS. 2A and 2B, the interconnect device 1400 includes an insulating frame 1401 made of various insulating materials (e.g., rubber and polymer), and the insulating frame 1401 includes a top insulating layer 1404, a bottom insulating layer 1405 and a central insulating layer 1406. The central insulating layer 1406 includes a plurality of insulators 1407 disposed between the top insulating layer 1404 and the bottom insulating layer 1405, and includes a plurality of through-holes 1409. A plurality of bridge conductors 1408 can be disposed within the through-holes 1409, respectively. Differently, the bridge conductors 1408 include a first portion 1412 adjacent to the top insulating layer 1404 and a second portion 1413 adjacent to the bottom insulating layer 1405. As can be seen from FIG. 14B, the first portion 1412 and the top insulating layer 1404 have a first width, the second portion 1413 and the bottom insulating layer 1405 have a second width, and the second width is greater than the first portion.

Figure 15A:
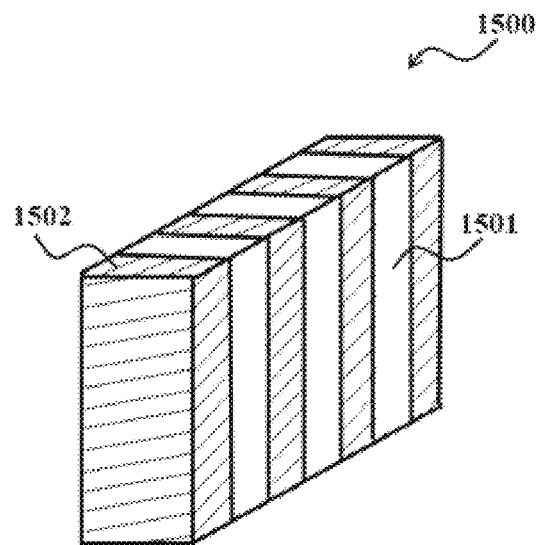
FIG. 15A is a schematic diagram showing an example of an I-shaped interconnect device according to another embodiment of the present application.
Figure 15B:
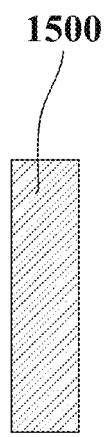
FIG. 15B is a side-view of the interconnect device shown in FIG. 15A.

FIG. 15A is a schematic diagram showing an example of a I-shaped interconnect device 1500 that can connect two adjacent semiconductor packages, and FIG. 15B is a side-view of the interconnect device 1500. Differently, the interconnect device 1500 does not include an insulating frame, but includes a plurality of individual insulators 1501. Every two of the plurality of bridge conductors 1502 are separated from each other by one of the plurality of insulators 1501. In an embodiment, the bridge conductors 1502 are attached to the insulators 1501 with an adhesive material, for example, with an insulating adhesive material. In another embodiment, the bridge conductors 1502 are attached to the insulators 1501 by soldering.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. An interconnect device, comprising:
an insulating frame, wherein the insulating frame comprises:
a top insulating layer formed uppermost of the insulating frame and occupying an entirety of a top surface of the insulating frame;
a bottom insulating layer formed lowermost of the insulating frame and occupying an entirety of a bottom surface of the insulating frame; and
a central insulating layer that includes a plurality of insulators disposed between the top insulating layer and the bottom insulating layer, wherein the plurality of insulators form a plurality of through-holes between a first lateral surface and a second lateral surface of the central insulating layer; and
a plurality of bridge conductors, wherein each of the plurality of bridge conductors is disposed within a respective one of the plurality of through-holes and extends between the first lateral surface and the second lateral surface of the central insulating layer.

2. The interconnect device of claim 1, wherein the insulating frame is formed integrally, or insulating blocks of the insulating frame are formed separately and then attached with each other.

3. The interconnect device of claim 1, wherein the plurality of bridge conductors comprises one or more conductive materials selected from the group consisting of the following: Al, Cu, Sn, Ni, Au, Ag, titanium (Ti), tungsten (W), or comprises solder.

4. The interconnect device of claim 1, wherein the bottom insulating layer has a width greater than that of the central insulating layer and the top insulating layer.

5. The interconnect device of claim 1, wherein:
the plurality of bridge conductors include a first portion adjacent to the top insulating layer and a second portion adjacent to the bottom insulating layer;
the first portion and the top insulating layer have a first width;
the second portion and the bottom insulating layer have a second width; and
the second width is greater the first width.

6. The interconnect device of claim 1, wherein the plurality of through-holes have a uniform shape.

7. The interconnect device of claim 5, wherein the plurality of through-holes are uniformly distributed between the top insulating layer and the bottom insulating layer.

8. The interconnect device of claim 1, wherein the insulating frame comprises one or more insulating materials selected from the group consisting of the following: rubber and polymer.

9. A semiconductor package assembly, comprising:
a first semiconductor package having a bottom surface, at least one lateral surface, one or more bottom connectors disposed on the bottom surface, and one or more lateral connectors exposed from one of the at least one lateral surface;
a second semiconductor package having a bottom surface, at least one lateral surface, one or more bottom connectors disposed on the bottom surface, and one or more lateral connectors exposed from one of the at least one lateral surface; and
an interconnect device disposed between the first semiconductor package and the second semiconductor package, wherein the interconnect device comprises:
an insulating frame, wherein the insulating frame comprises:
a top insulating layer formed uppermost of the insulating frame and occupying an entirety of a top surface of the insulating frame;
a bottom insulating layer formed lowermost of the insulating frame and occupying an entirety of a bottom surface of the insulating frame; and
a central insulating layer that includes a plurality of insulators disposed between the top insulating layer and the bottom insulating layer, wherein the plurality of insulators form a plurality of through-holes between a first lateral surface and a second lateral surface of the central insulating layer; and
a plurality of bridge conductors, wherein each of the plurality of bridge conductors is disposed within a respective one of the plurality of through-holes and extends between the first lateral surface and the second lateral surface of the central insulating layer, such that at least one lateral connector of the first semiconductor package is electrically connected to at least one lateral connector of the second semiconductor package via at least one of the plurality of bridge conductors.

10. The semiconductor package assembly of claim 9, wherein the first semiconductor package comprises:
a first substrate having one or more conductive layers;
one or more semiconductor devices disposed on the first substrate; and
wherein the one or more lateral connectors are disposed on the first substrate and connected to at least one of the one or more semiconductor devices via the one or more conductive layers in the first substrate.

11. The semiconductor package assembly of claim 9, wherein the interconnect device has a height not smaller than that of the first semiconductor package and the second semiconductor package.

12. The semiconductor package assembly of claim 9, wherein the bottom insulating layer of the interconnect device is below the bottom surface of the first semiconductor package and the bottom surface of the second semiconductor package.

13. A semiconductor package assembly, comprising:
a first semiconductor package having a bottom surface, at least one lateral surface, one or more bottom connectors disposed on the bottom surface, and one or more lateral connectors exposed from one of the at least one lateral surface;
a second semiconductor package having a bottom surface, at least one lateral surface, one or more bottom connectors disposed on the bottom surface, and one or more lateral connectors exposed from one of the at least one lateral surface; and
an interconnect device disposed between the first semiconductor package and the second semiconductor package, wherein the interconnect device comprises:

a plurality of insulators;

a plurality of bridge conductors, wherein every two of the plurality of bridge conductors are separated from each other by one of the plurality of insulators, and at least one lateral connector of the first semiconductor package is electrically connected to at least one lateral connector of the second semiconductor package via at least one of the plurality of bridge conductors.

14. The semiconductor package assembly of claim 13, wherein the interconnect device further comprises a top insulating layer formed above the plurality of insulators and the plurality of bridge conductors.

15. The semiconductor package assembly of claim 13, wherein the interconnect device further comprises a bottom insulating layer formed below the plurality of insulators and the plurality of bridge conductors.

* * * * *